United States Patent [19]

Crowle

[11] 3,816,769

[45] June 11, 1974

[54] METHOD AND CIRCUIT ELEMENT FOR THE SELECTIVE CHARGING OF A SEMICONDUCTOR DIFFUSION REGION

[75] Inventor: Brian Crowle, Dorchester, England

[73] Assignee: Integrated Photomatrix Ltd., Dorset, England

[22] Filed: Dec. 14, 1970

[21] Appl. No.: 97,495

[30] Foreign Application Priority Data

Dec. 17, 1969 Great Britain .................... 61483/69
Jan. 30, 1970 Great Britain ...................... 4676/70

[52] U.S. Cl. .......... 307/304, 317/235 B, 317/235 R
[51] Int. Cl. ............................................ H01l 11/14
[58] Field of Search ................ 317/235, 231, 235 B; 307/304, 238

[56] References Cited

UNITED STATES PATENTS

| | | | |
|---|---|---|---|
| 2,918,628 | 10/1971 | Stuetzer | 330/39 |
| 3,045,129 | 7/1962 | Atalla et al. | 317/235 X |
| 3,102,230 | 8/1963 | Kahng | 317/235 X |
| 3,246,173 | 4/1966 | Silver | 317/235 X |
| 3,356,858 | 12/1967 | Wanlass | 317/235 |
| 3,560,815 | 2/1971 | Sigsbee | 317/234 |
| 3,576,477 | 4/1971 | Koai | 317/235 |
| 3,591,836 | 7/1971 | Booker | 317/231 |
| 3,611,070 | 10/1971 | Engeler | 317/234 |
| 3,621,283 | 11/1971 | Teer et al. | 317/235 |
| 3,660,697 | 5/1972 | Berglund et al. | 317/235 |

OTHER PUBLICATIONS

Electronics, "Charge Storage Lights the Way . . .".

*Primary Examiner*—Jerry D. Craig
*Attorney, Agent, or Firm*—Burns, Doane, Swecker & Mathis

[57] ABSTRACT

The disclosure relates to a method and a circuit element comprising a substrate of a first type of semi-conductive material, having a diffusion region of opposite type of semi-conductive material formed therein, a terminal for the substrate remote from the diffusion region, a gate region having a metallised region extending over a region of the substrate adjacent the diffusion region and insulated from the substrate by a layer of suitable insulating material, the arrangement being such that, on suitably biassing the circuit element and on applying suitable pulses to the gate region of the appropriate sign and of magnitude greater than the characteristic threshold voltage of the gate region, the diffusion region will acquire charge of one sign during fluctuations in gate metallisation potential towards one sign (e.g. negative going) and lose a smaller amount of such charge during such fluctuations in the opposite direction (positive going) thereby acquiring a net amount of charge of the one sign.

17 Claims, 7 Drawing Figures

Brian Crowle Inventor

By Peter Hinzelke
His Attorney

Brian Crowle
Inventor

By Peter H. Smolka
His Attorney

Brian Crowle
Inventor

By Peter H. Smolka
His Attorney

METHOD AND CIRCUIT ELEMENT FOR THE SELECTIVE CHARGING OF A SEMICONDUCTOR DIFFUSION REGION

BACKGROUND OF THE INVENTION

The invention relates to a method and circuit element for use with field-effect transistors of the metal-oxide semi-conductor type (M.O.S.T.) and particularly but not solely p-channel enhancement mode, metal-oxide silicon transistors.

The invention provides a circuit element comprising a substrate of a first type of semi-conductive material, having a diffusion region of opposite type of semi-conductive material formed therein, a terminal for the substrate remote from the diffusion region, a gate region having a metallised region extending over a region of the substrate adjacent the diffusion region and insulated from the substrate by a layer of suitable insulating material, the arrangement being such that, on suitably biassing the circuit element and on applying suitable pulses to the gate region of the appropriate sign and of magnitude greater than the characteristic threshold voltage of the gate region, the diffusion region will acquire charge of one sign during fluctuations in gate metallisation potential towards one sign (e.g. negative going) and lose a smaller amount of such charge during such fluctuations in the opposite direction (positive going) thereby acquiring a net amount of charge of the one sign.

In a preferred form the substrate is of n-type silicon and the diffusion region is of p-type silicon in which case the pulses applied are negative and diffusion region acquires a certain amount of negative charge during the negative going fluctuations in the gate metallisation potential and loses a smaller amount of negative charge during the positive going fluctuations in gate metallisation potential, so as to acquire a net amount of negative charge during one fluctuation period.

In a further preferred form of the invention the whole of the surface of the substrate and diffusion region is covered with a layer of suitable insulating material except in those regions of the substrate surface where electrical contacts to the substrate or to the diffusion region are required.

The layer of insulating material under the gate metallisation region may be of less thickness than the surrounding insulating material or may be of different composition provided that it is possible to form an inversion layer in the substrate beneath the metallisation for certain values of metallisation to substrate potential differences.

The gate metallisation region may overlap the diffusion region to ensure electrical continuity between the inversion layer and the diffusion region.

A plurality of diffusion regions may be provided in a single substrate and there may be one or more adjacent gate regions so that charge may be transferred from the inversion layer to the diffusion layer or vice versa. For example, one gate region may be provided adjacent two diffusion regions which may differ in area.

In another aspect the invention provides a method of operating a circuit element which element comprises a substrate of a first type of semi-conductive material, having a diffusion region of opposite type of semi-conductive material formed therein, a terminal for the substrate remote from the diffusion region, a gate region having a second metallised region extending over a region of the substrate adjacent the diffusion region and insulated from the substrate by a layer of suitable insulating material, which method comprises the steps of suitably biassing the circuit element, applying a pulse to the gate region of an appropriate sign and of magnitude greater than the characteristic threshold voltage of the gate region, so that the diffusion region will acquire charge of one sign during fluctuations in gate potential towards the one sign (e.g. negative going) and lose a smaller amount of such charge during such fluctuations in the opposite direction (positive going) thereby acquiring a net amount of charge of the one sign.

The invention further provides an arrangement including a circuit element according to the invention wherein there are capacitive coupling means associated with the diffusion region to feed an output signal significant of the charge acquired by the diffusion region.

The circuit element may be used to bias a field-effect transistor of the M.O.S. type (particularly a p-channel enhancement mode, metal-oxide silicon transistor) in which case the capacitive coupling may comprise a second metallised region in contact with the diffusion region forming a contact terminal which may be connected to the gate terminal of the transistor, and in another aspect, the invention includes the combination of the circuit element and the transistor connected in the aforementioned manner.

Preferably the circuit element and the transistor are in integrated form and this is of particular value since the element performs a function which is difficult to realise using conventional integrated circuit configurations.

The invention includes a radiation detector incorporating a circuit element as described above.

Any diode diffusion region which acquires charge from one or more gate regions as described above shall be termed hereinafter a REFIL (REcharge From Inversion Layer) diode.

DETAILED DESCRIPTION

Figure 1A:
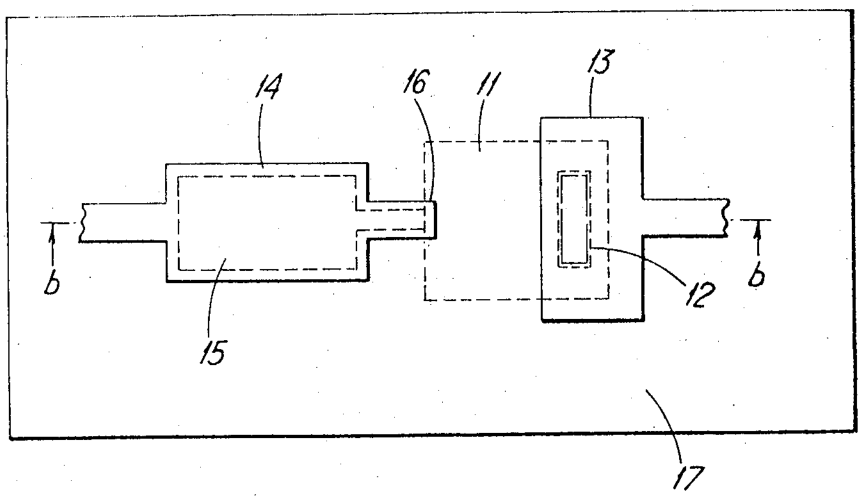
Figure 1B:
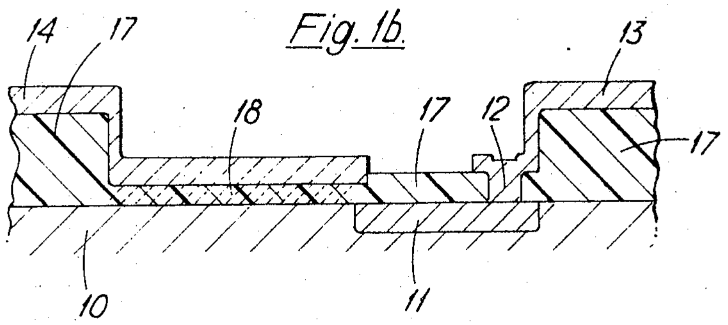
Figure 2:
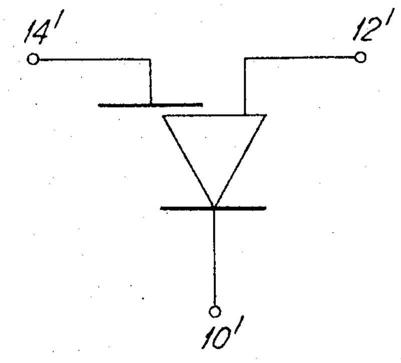
Figure 3A:
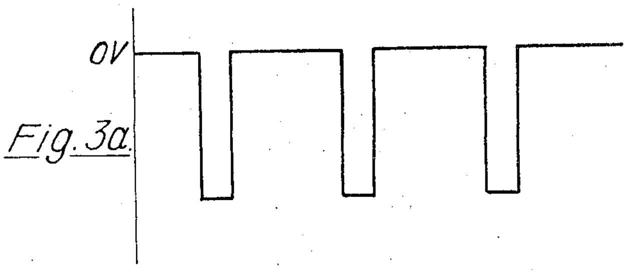
Figure 3B:
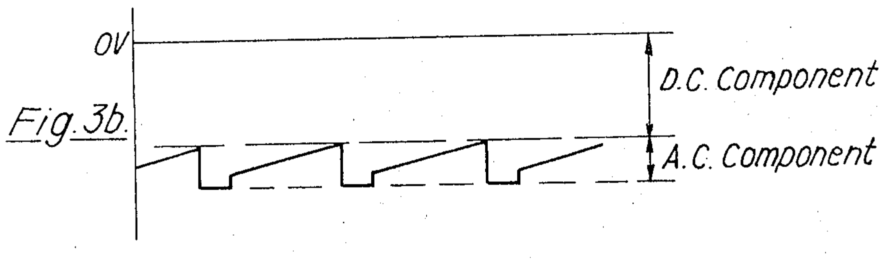
Figure 4:
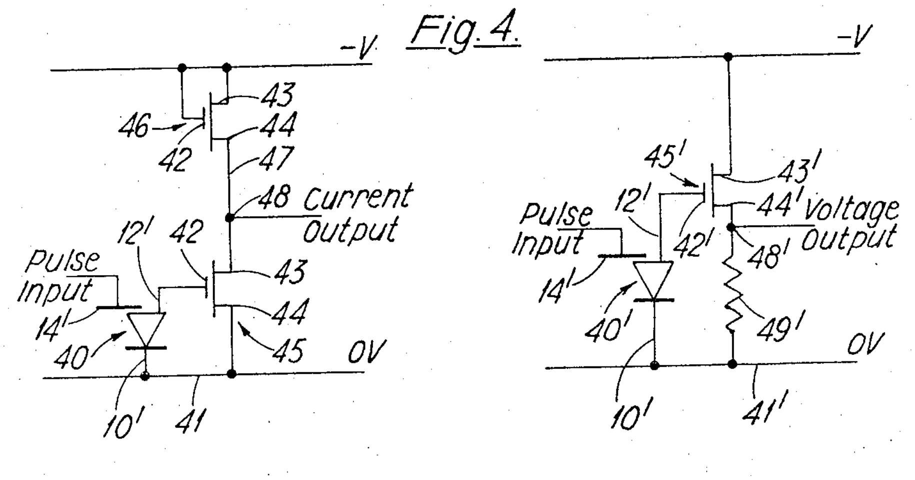
Figure 5:
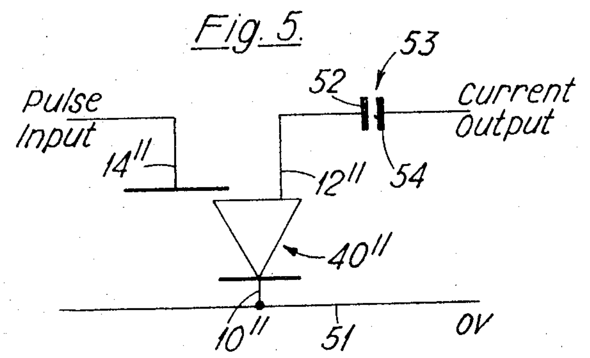
Figure 6A:
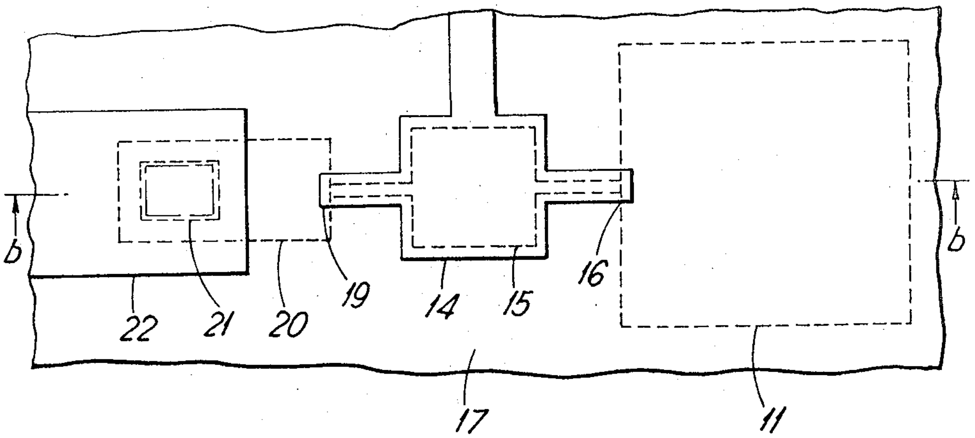
Figure 6B:
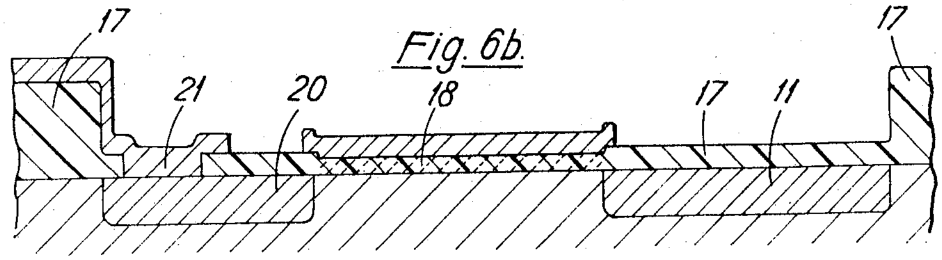

In order that the invention may be readily understood some specific embodiments thereof will now be described by way of example only with reference to the accompanying drawings in which:

FIG. 1*a* is a plan view with hidden detail showing schematically a first embodiment of REFIL diode according to the invention;

FIG. 1*b* is a cross-sectional view of the REFIL diode taken along the line *b—b* of FIG. 1;

FIG. 2 shows a symbol used to indicate the REFIL diode;

FIGS. 3*a* & 3*b* show two graphs illustrating the variations of the potential of the diffusion region with gate potential;

FIG. 4 shows two possible circuits in which the REFIL diode is connected to the gate of an M.O.S.T. and FIG. 5 is a circuit diagram illustrating a second use of the REFIL diode;

FIG. 6*a* is a plan view with hidden detail showing schematically a second form of REFIL diode according to the invention;

FIG. 6*b* is a cross-sectional view of the REFIL diode taken along the line *b—b* of FIG. 6*a;*

Figures 7A, 7B:
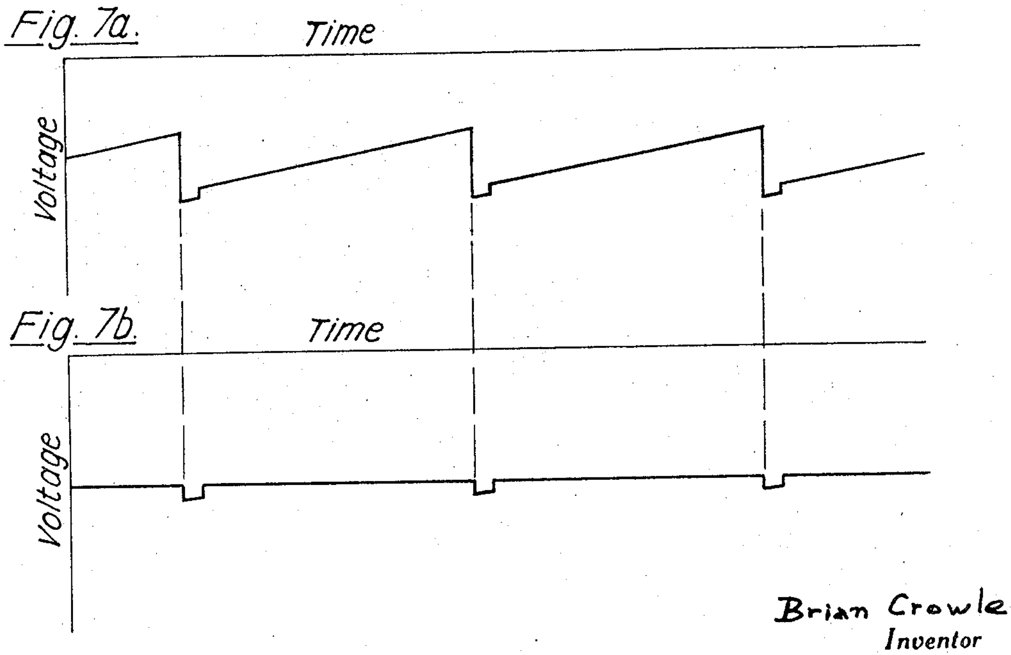

FIG. 7*a* is a graph showing the variations of the voltage with time in one of the diffusion regions; and FIG. 7*b* is a graph showing the variation of the voltage with time in the other diffusion region.

DETAILED DESCRIPTION

Referring now particularly to FIG. 1*a* and FIG. 1*b* a substrate 10 (which is present over the whole area within the rectangle) of n-type material contains the diffused region 11 of p-type material and supports a layer of insulating material 17 which extends over the whole of the surface except in a contact region 12. Metallised regions 13 and 14 extend across the insulator to terminals (not shown). Region 13 makes electrical contact with the region 11 via a hole in the insulating material forming the contact region 12. An inversion layer in the substrate may be formed within, and defined in extent by, the boundaries of region 15 as will be explained below. This takes place at a certain value $V_p$ of the metallisation to substrate potential difference. Region 15 is generally known as a gate region; and in this example, is differentiated from its surroundings in that the thickness of the covering insulation is reduced and the absence of the diffusion region within its boundaries. Other methods of producing a gate region are known notably by altering the composition of the insulator rather than the thickness. An inversion layer may also be formed, in this example, outside regions 15 and 11 but within region 14. However, this occurs at metallisation to substrate potential differences several times greater than $V_p$ and, because of this, is not generally of practical value.

A narrow strip of metallisation extends across a neck region of the substrate from the metallisation region 14 and overlaps the diffusion region at 16. The overlap region 16 ensures electrical continuity between the inversion layer in region 15 and the diffusion region 11, but may be made arbitrarily small.

A terminal (not shown) is provided for the substrate at a position remote from the diffusion region.

A symbol which will be used to denote a REFIL diode is shown in FIG. 2, wherein 14' is a terminal for the gate region, 12' a terminal for the diode contact region and 10', a terminal for the substrate.

The REFIL diode is manufactured using similar techniques to those used in the production of an M.O.S.T.

In operation of the device a fluctuating potential in the form of pulses negative with respect to the substrate having relatively fast positive going edges (e.g. of the order of 1$\mu$s fall time) are applied to the gate metallisation. Each negative going edge causes an inversion layer to form below the gate region, positive charge being drawn from the diffusion region. This causes the diffusion region to acquire a certain amount of negative charge during negative going edge of each pulse and to lose a smaller amount of negative charge during the positive going edge of each pulse thereby acquiring a net amount of negative charge during each pulse and becoming reverse biassed. This is because the potential of the inversion layer is discharged before the charge stored in the diode can be neutralised by reverse flow of positive charge back to the diffusion region through the neck region.

Every diffused diode formed as described above, passes a small amount of current, (usually referred to as leakage current) when reverse biassed. Thus, charge stored on the diode in this condition will gradually be lost. An increase in the width of the neck region results in an increase in the amount of charge lost during the positive going edge of the applied potential reducing the net gain of charge per cycle.

FIG. 3*a* shows, by way of example, the variations in potential of a REFIL diode when the rate of leakage charge becomes comparable to the rate at which charge is acquired in the manner described above. In this example, a series of pulses, as shown in FIG. 3*a* is applied to the gate metallisation. The potential of the diode then takes the form shown in FIG. 3*b*. The relative values of the sawtooth waveform amplitude and the mean d.c. level are determined by the relative sizes and geometries of the diode and the gate metallisation region. By making the area of gate metallisation small, the sawtooth amplitude is made small with respect to the d.c. level. A small alteration in the rate of leakage of charge then produces a large shift in the mean d.c. level. The REFIL diode thus acts as a sensitive leakage current to quasi d.c. level convertor. Both a.c. and the d.c. components of the waveform vary with the pulse repetition rate and the leakage current, thus for a given repetition rate either component may be used to monitor the leakage current. This has applications where, for example, the leakage current in the diode is related to a physical parameter such as temperature, or when the diode is subjected to radiation (e.g. illumination).

FIG. 4 shows two circuits in which the REFIL diode is followed directly by an M.O.S.T. amplifier giving both d.c. and a.c. components in the output.

In the example shown in the circuit diagram on the left hand side negative pulses are applied to a gate 14' of a REFIL diode 40 whose substrate terminal 10' is at zero potential by connection to line 41. The contact 12' of the REFIL diode 40 is connected to the gate 42 of an M.O.S.T. 45 whose source 44 is connected to line 41 and whose drain 43 is connected by line 47 to a source 44 of a second M.O.S.T. 46 whose gate 46 is connected to negative supply rail –V, the drain 43 also being connected to negative supply rail –V. The drain current in the M.O.S.T. is related to the REFIL diode potential and the current output is drawn from the tapping point 48.

In the example shown in the circuit diagram on the right hand side, negative pulses are applied to a gate 14' of the REFIL diode 40' whose substrate terminal 10' is biassed at zero potential by connection to rail 41'. The contact 12' is connected to the gate 42' of M.O.S.T. 45', whose source 44' is connected to rail 41' via resistor 49'. The drain 43' of M.O.S.T. 45' is connected to negative supply rail –V. The voltage output is taken from the tap off 48'.

The circuits provided current and voltage outputs which can be sensed externally without affecting the REFIL diode leakage current, the amplifying M.O.S.T's 42 and 42' acting as a buffer stage between the output and the diode. Under suitable conditions the circuits provide an analogue quasi d.c. signal the value of which is determined by the physical conditions mentioned above. There are a number of applications for such circuits particularly for analogue or switched light to voltage convertors.

FIG. 5 shows a circuit wherein negative pulses are applied to the gate 14'' of a REFIL diode 40'' whose substrate terminal 10'' is connected to a source of zero potential by line 51. The contact 12'' is coupled to one plate 52 of a capacitor 53 the other plate of the capacitor providing a current output in which only the a.c. component of the diode waveform appears. Again a negative going pulse edge causes a voltage shift as shown in FIGS. 3*a* and 3*b*. This voltage shift causes a current transient to appear in the capacitor, the amplitude of which depends on the mean d.c. level of the diode potential, and can therefore be related to diode leakage and hence to external parameters, e.g. illumination.

This application is intended primarily for large arrays of photodiodes whose simplicity of the diode element, resulting in close packing and high yield is of major importance.

Referring now particularly to FIGS. 6*a* and 6*b* in a second embodiment a substrate 10 of n-type silicon contains a first diffusion region 11 of P-type silicon and a second diffusion region 20 also of P-type silicon and of much smaller cross-sectional area than the region 11. The substrate is covered by a layer of insulating material 17 over its whole surface with the exception of a small contact region 21 where a metallisation region 22 contacts the diffusion region 20 and extends across the insulator to a terminal (not shown).

A second metallisation region 14 extends across the insulator to a terminal (not shown). This second metallisation region forms a gate region and a narrow strip of metallisation extends across the substrate from such gate region to overlap the diffusion regions at 16 and 19, respectively. The overlap regions ensure electrical continuity between an inversion layer (which is formed in a region 15 in the substrate when the gate region is suitable biassed), and the diffusion regions.

A terminal (not shown) is provided for the substrate at a position remote from the diffusion regions.

If both diffusion regions are negatively biassed with respect to the substrate and the whole structure is evenly illuminated from the side of the REFIL diode remote from the substrate, and if the metallisation region 14 is at substrate potential, the rate of change of potential of region 11 as a result of loss of charge as leakage current induced by the illumination, is much greater than that of region 20. If the metallisation, region is at a sufficiently great negative potential with respect to the substrate, an inversion layer forms in the region of the substrate indicated as region 15 and, under these conditions, any potential difference between the diffusion regions will tend to zero since charge will be transferred between these regions via the inversion layer 15.

The main factors which determine the rates of change of potential of the two diffusion regions when negatively biassed and evenly illuminated are:

1. The area of the diffusion region exposed to light.
2. The total capacitance of each diffusion region to the substrate (earth) plus any capacitance due to metallisation, externally connected components etc.
3. The intensity of the illumination.

To achieve the situation in which region 11 changes potential faster than region 20 when both are illuminated with equal intensity the exposed area of region 11 is made greater than that of region 20 and the capacitance to substrate of region 20 is increased by extending the metallisation region 22 (for example) which is connected to region 20. The size and shape of region 14 has a small effect on this relative rate of potential change whilst the presence of any metallisation in the vicinity of either diffusion region (but not overlapping) also alters the relative rates slightly. However, the last two effects are usually so small that they may be ignored.

Referring now more particularly to FIGS. 7*a* and 7*b*, on steadily and evenly illuminating the REFIL diode from the side remote from the substrate, and applying a series of negative pulses to the metallisation 14, both diffusion regions acquire negative charge in the manner described above. When the rate of supply of charge in this manner becomes comparable with the rate or loss of charge as leakage current in region 11 the voltage waveform in the latter region is as shown in FIG. 7*a* and the voltage waveform in region 20 is as shown in FIG. 7*b*. Diffusion region 20 acquires substantially the same potential as region 11 while the metallisation region 14 is negative, and retains this potential while the metallisation region is at substrate potential.

Thus the potential of the diffusion region 20 is sampled during the "on" period and held during the "off" period of a pulse generator supplying said negative pulses to the gate region, a technique which becomes more effective as the mark/space ratio is reduced.

This form of REFIL diode is particularly useful in optoelectronic detectors where a relatively smooth analogue output is required, the value of which depends on the intensity of incident illumination. In this application the diffusion region 20 is connected to an M.O.S.T. analogue amplifier of infinite input impedance. The output of this amplifier then gives the required voltage or current characteristic. A trigger and complementary outputs may be added to the circuit making a compact and highly versatile device.

I claim:

1. A chargeable circuit element comprising:

a substrate of a first type of semi-conductive material;

a chargeable diffusion region of opposite type of semi-conductive material formed at a surface of the substrate;

an output terminal connected to the diffusion region for coupling an output signal from the circuit element to an external circuit;

a substrate terminal for establishing an electrical connection with the substrate remote from the diffusion region;

a layer of insulating material on the surface of the substrate;

a layer of metallization on the insulation layer and defining at the surface of the substrate a gate region which extends across the substrate to a location adjacent the diffusion region and serves to supply charge to the chargeable diffusion region through the selective formation of an inversion region substantially coterminous with the metallization layer in response to the application of a potential of one sign to the metallization layer; and, means for applying electrical pulses to the layer of metallization defining the gate region;

the metallization layer defining the gate region comprising a portion of relatively large surface area spaced from the diffusion region and a relatively strip-like portion extending across the substrate from the portion of relatively large surface area to a location adjacent the diffusion region, the diffusion region thereby being operable to acquire a charge of the one sign during fluctuations in gate metallization potential toward the one sign and to lose a smaller amount of charge during fluctuations in gate metallization potential toward the other sign, the diffusion region thereby being operable to acquire a net amount of charge of the one sign.

2. A circuit element according to claim 1 wherein the substrate is of N-type silicon and the diffusion region is of P-type silicon.

3. A circuit element according to claim 1 wherein the insulating material extends over the entire surface of the substrate and diffusion region except in contact regions thereof.

4. A circuit element according to claim 3 wherein the insulating material beneath the metallisation layer is of less thickness than surrounding insulating material.

5. A circuit element according to claim 3 wherein the insulating material beneath the metallisation layer differs in composition from the surrounding insulating material.

6. A circuit element according to claim 1 wherein a plurality of diffusion regions are provided in the substrate and a single layer of metallization extends across the substrate to a location adjacent each diffusion region.

7. A circuit element according to claim 1 wherein the metallization layer defining the gate region comprises a portion of relatively large surface area spaced from the diffusion region and a relatively strip like portion extending across the substrate from the portion of relatively large surface area to a location adjacent the diffusion region.

8. An arrangement including a circuit element according to claim 1 including capacitive coupling means operatively connected to the diffusion region for providing an output signal related to the charge acquired by the diffusion region.

9. An arrangement according to claim 8 wherein the capacitive coupling means comprises a second metallised region in contact with the diffusion region and connected to the gate terminal of a metal oxide silicon transistor.

10. An integrated circuit including an arrangement according to claim 9.

11. An electrical circuit comprising:

a circuit element including:

a substrate of a first type of semi-conductive material;

a chargeable diffusion region of opposite type of semi-conductive material formed at a surface of the substrate;

a substrate terminal remote from the diffusion region;

a layer of insulating material on the surface of the substrate;

a layer of metallization on the insulating layer and comprising a portion of relatively large surface area spaced from the diffusion region and a relatively narrow strip-like portion extending across the substrate from the portion of relatively large surface area to a location adjacent the diffusion region, the metallization layer defining at the surface of the substrate a gate region which extends across the substrate to a location adjacent the diffusion region and serves to supply charge to the diffusion region through the selective formation of an inversion layer substantially coterminous with the metallization layer;

means for biasing the substrate terminal of the circuit element; means for applying electrical pulses to the layer of metallization defining the gate region;

the pulses being of an appropriate sign and a magnitude greater than a threshold voltage at which the inversion layer is formed in the gate region whereby the chargeable diffusion region acquires charge of one sign during fluctuations in gate metallization potential toward the one sign and loses a smaller amount of such charge during the fluctuations in gate metallization potential toward the opposite sign, the diffusion region thereby acquiring a net amount of charge of the one sign; and, means for coupling an output signal from the chargeable diffusion region, the output signal being related to the net amount of charge of the one sign.

12. A radiation detector comprising:

a circuit element including:

a substrate of a first type of semi-conductive material;

a first chargeable diffusion region of semi-conductive material of opposite type relative to the material of the substrate, said first chargeable diffusion region being formed at a surface of the substrate to permit exposure thereof to radiation to be detected;

a second chargeable diffusion region of semi-conductive material of opposite type relative to the material of the substrate, formed at a surface of the substrate to permit exposure thereof to the radiation to be detected;

a substrate terminal for establishing an electrical connection with the substrate remote from the diffusion regions;

a layer of insulating material on the surface of the substrate;

a first layer of metallization on the insulating layer and defining at the surface of the substrate a gate region which extends across the substrate to a location adjacent each diffusion region and serves to supply charge to the diffusion regions, said first layer of metallization comprising a portion of relatively large surface area spaced from each diffusion region and relatively narrow strip-like portions extending across the substrate from said portion of relatively large surface area to locations adjacent each diffusion region; and a second metallization region electrically connected to the second diffusion region to form a terminal for the second diffusion region; means for applying electrical pulses between the first layer of metallization defining the gate region and the substrate terminal, the electrical pulses being of appropriate sign and of a magnitude greater than a threshold voltage at which an inversion layer substantially coterminous with the first layer of metallization is formed in the gate region, whereby the diffusion regions will acquire charge of one sign during fluctuation in gate metallization potential toward the one sign and lose a smaller amount of such charge during fluctuations in the gate metallization potential toward the opposite sign, the diffusion regions thereby acquiring a net amount of charge; and an amplifier of substantially infinite input impedance to direct current electrically connected to the terminal formed by the second metallization region, the amplifier providing an output signal related to the level of radiation to which the first diffusion region is exposed.

13. A radiation detector according to claim 12 wherein the first diffusion region is of larger surface area than the second diffusion region.

14. A method of operating a circuit element, which circuit element includes a substrate of a first type of semi-conductive material, a chargeable diffusion region of opposite type of semi-conductive material formed at a surface of the substrate, a terminal for the substrate remote from the diffusion region, a gate region defined at a surface of the substrate by a layer of metallization having a portion of relatively large surface area extending over a region of the substrate spaced from the diffusion region and a relatively narrow strip-like portion extending from the portion of relatively large surface area to a location adjacent the diffusion region with the metallization layer insulated from the substrate by a layer of insulating material, the method comprising the steps of:

biasing the substrate terminal of the circuit element; and applying to the layer of metallization defining the gate region periodic pulses of an appropriate sign and of a magnitude greater than a threshold voltage at which an inversion layer is formed in the gate region substantially coterminous with the layer of metallization defining the gate region, so that the diffusion region acquires, from the inversion layer, charge of one sign during fluctuations in pulse potential toward the one sign and loses a smaller amount of such charge during fluctuations in pulse potential toward the opposite sign, the diffusion region thereby acquiring a net amount of charge of the one sign.

15. A method according to claim 14 wherein the net amount of charge acquired is related to the amount of leakage current from the diffusion region during the period between pulses and including the further steps of:

exposing the circuit element to a condition to be monitored, the condition affecting the amount of leakage current; and monitoring the net amount of charge of the one sign acquired by the diffusion region to provide an indication related to the condition

16. The method of claim 15 wherein the circuit element is exposed to temperature variations and the condition indicated is temperature.

17. The method of claim 16 wherein the circuit element is exposed to radiation and the condition indicated is the level of radiation.

* * * * *